United States Patent
Tsuchida et al.

(10) Patent No.: US 7,719,301 B2
(45) Date of Patent: May 18, 2010

(54) TESTING METHOD OF SEMICONDUCTOR INTEGRATED CIRCUIT AND INFORMATION RECORDING MEDIUM

(75) Inventors: Hiromi Tsuchida, Kadoma (JP); Akihiro Maejima, Kadoma (JP); Jinsaku Kaneda, Kadoma (JP); Eisaku Maeda, Kadoma (JP)

(73) Assignee: Panasonic Corporation, Osaka (JP)

( * ) Notice: Subject to any disclaimer, the term of this patent is extended or adjusted under 35 U.S.C. 154(b) by 146 days.

(21) Appl. No.: 12/066,748

(22) PCT Filed: Mar. 6, 2007

(86) PCT No.: PCT/JP2007/054247

§ 371 (c)(1),
(2), (4) Date: Mar. 13, 2008

(87) PCT Pub. No.: WO2007/113968

PCT Pub. Date: Oct. 11, 2007

(65) Prior Publication Data

US 2009/0237104 A1    Sep. 24, 2009

(30) Foreign Application Priority Data

Mar. 31, 2006    (JP) .............................. 2006-096184

(51) Int. Cl.
    *G01R 31/26*    (2006.01)
(52) U.S. Cl. .................................. 324/765; 324/158.1
(58) Field of Classification Search ................ 324/72.5, 324/73.1, 158.1, 750–758, 760–765, 719, 324/537; 439/480–482, 824; 360/51; 327/265; 714/724–727, 730–733
See application file for complete search history.

(56) References Cited

U.S. PATENT DOCUMENTS 5,511,005 A    4/1996    Abbe et al. .................. 364/552

FOREIGN PATENT DOCUMENTS

| JP | 60-46044 | 3/1985 |
| JP | 3-52247 | 3/1991 |
| JP | 8-147369 | 6/1996 |

*Primary Examiner*—Minh N Tang
*Assistant Examiner*—Trung Q Nguyen
(74) *Attorney, Agent, or Firm*—Steptoe & Johnson LLP

(57) ABSTRACT

A testing method of semiconductor integrated circuit wherein the quality of diffusion for semiconductor chips can be tested before the semiconductor chips become packaged semiconductor integrated circuits is provided. Input data is set, and circuit current values I(L) and I(H) obtained for each of a plurality of circuit areas are compared with first test pass ranges I1(L) and I1(H) to extract articles within the first test pass (S2), and the current values of the circuit areas determined to be articles within the first test pass and second test pass ranges I2(L), and I2(H) determined based on these current values are compared, thereby conducting a retest to extract circuit areas within the second test pass. The current values may be replaced by the voltage values.

17 Claims, 7 Drawing Sheets

TESTING METHOD OF SEMICONDUCTOR INTEGRATED CIRCUIT AND INFORMATION RECORDING MEDIUM

TECHNICAL FIELD

The present invention relates to a testing method of semiconductor integrated circuit in which a plurality of semiconductor integrated circuits, each consisting of the same circuit, is tested on a test unit basis.

BACKGROUND ART

For semiconductor integrated circuit testing, a high temperature burn-in test has been conducted. In the high temperature burn-in test, a semiconductor integrated circuit is set in a high-temperature environment to enter a high-temperature state at the completed product stage, that is, after a semiconductor chip cut out from a wafer is mounted on the base of a package, the semiconductor chip and external connection terminals of the package are electrically connected, and the package is molded, and an input signal in an operating state is supplied to an input terminal of the semiconductor integrated circuit, and whether or not an output signal of that semiconductor integrated circuit is in a predetermined output state is tested.

More specifically, as shown in FIG. 7, in a semiconductor integrated circuit, an input of a preceding circuit 1 consisting of MOS transistors is connected to an external connection terminal 2, an output of a succeeding circuit 3 consisting of MOS transistors is connected to an external connection terminal 4, and between an output of the preceding circuit 1 and an input of the succeeding circuit 3, an internal circuit 5 consisting of MOS transistors is interposed. A semiconductor integrated circuit containing in the package thereof a semiconductor chip 6 having the aforementioned semiconductor integrated circuit, upon occurrence of a defective crystal, a crack or an oxide film abnormality, etc., may normally operate at room temperature, but if the temperature becomes high, the semiconductor integrated circuit may become defective in that the delay time fluctuates due to leakage current of the integrated MOS circuit, or may also become defective in that a logic level error occurs on the way to transmit a signal from the input side to the output side.

Even though it has turned out that such defects are caused by the leakage current of the MOS circuit, the leakage current of the circuits that cannot be directly monitored, such as an input terminal or output terminal of the internal circuit 5, cannot be measured, so a high-temperature burn-in test has been conducted by inputting a direct current voltage or pulses in a high-temperature environmental condition to determine whether or not the logic circuit exhibits an output of a regular logic output level (H level/L level), thereby determining whether the circuit is non-defective or defective. When a logic circuit containing a counter is a test target, a so-called functional test has been conducted, the functional test determining whether the logic circuit is non-defective or defective based on whether or not the logic circuit exhibits a logic output according to the number of pulses input.

Patent Document 1: Japanese Patent Laid-Open No. 3-52247

Patent Document 2: Japanese Patent Laid-Open No. 6-29301

In order to conduct such high-temperature burn-in test, it is necessary to wait until the packaged semiconductor integrated circuit becomes stable at a high temperature, so the test can not be conducted in a short period of time, which is not suitable for mass production. Also, the quality of diffusion for the semiconductor chips cannot be tested until the final stage in which the semiconductor chips become completed packaged semiconductor integrated circuits, and as a result, the overall yield has been lowered.

An object of the present invention is to provide a testing method of semiconductor integrated circuit capable of testing the quality of diffusion for semiconductor chips before the semiconductor chips become packaged semiconductor integrated circuits.

DISCLOSURE OF THE INVENTION

A testing method of semiconductor integrated circuit according to claim 1 of the present invention provides a method for testing, on a test unit basis, a plurality of semiconductor integrated circuits each containing a same circuit, the method comprising: setting input data, and comparing a current value or a voltage value of an external connection terminal obtained for each of the plurality of semiconductor integrated circuits with a first test pass range to extract semiconductor integrated circuits within the first test pass from the plurality of semiconductor integrated circuits; and comparing a second test pass range determined based on the current values or the voltage values of the semiconductor integrated circuits extracted as being within the first test pass, the second test pass range being narrower than the first test pass range, and the current values or the voltage values of the plurality of semiconductor integrated circuits, thereby conducting a retest to extract semiconductor integrated circuits within the second test pass.

A testing method of semiconductor integrated circuit according to claim 2 of the present invention provides a method for testing, on a wafer basis, circuit areas of a plurality of semiconductor integrated circuits each containing a same circuit, the method comprising: setting input data, and comparing a current value or a voltage value of an external connection terminal obtained for each of the plurality of semiconductor integrated circuits with a first test pass range to extract semiconductor integrated circuits within the first test pass from the plurality of semiconductor integrated circuits; and comparing a second test pass range determined based on the current values or the voltage values of the semiconductor integrated circuits extracted as being within the first test pass, the second test pass range being narrower than the first test pass range, and the current values or the voltage values of the plurality of semiconductor integrated circuits, thereby conducting a retest to extract semiconductor integrated circuits within the second test pass.

A testing method of semiconductor integrated circuit according to claim 3 of the present invention provides a method for testing, on a wafer basis, circuit areas of a plurality of semiconductor integrated circuits each containing a same circuit, the method comprising: setting input data, and comparing a current value or a voltage value of an external connection terminal obtained for each of the plurality of circuit areas with a first test pass range to extract semiconductor integrated circuits within the first test pass from the plurality of semiconductor integrated circuits; and comparing a second test pass range determined based on the current values or the voltage values of the semiconductor integrated circuits extracted as being within the first test pass, the second test pass range being narrower than the first test pass range, and the current values or the voltage values of the plurality of semiconductor integrated circuits, thereby conducting a retest to extract semiconductor integrated circuits within the second test pass, and storing the test results in association with addresses on the wafer of the circuit areas.

A testing method semiconductor integrated circuit according to claim 4 of the present invention provides a method according to claim 2 or 3, wherein the second test pass range is set based on an average value and a standard deviation value of the current values or the voltage values of the plurality of semiconductor integrated circuits.

A testing method of semiconductor integrated circuit according to claim 5 of the present invention comprises executing the testing method of semiconductor integrated circuit according to claim 1 by running a plurality of testing devices in parallel and determining the second test pass range based on a plurality of current values or voltage values obtained by the plurality of testing devices.

A testing method of semiconductor integrated circuit according to claim 6 of the present invention comprises executing the testing method of semiconductor integrated circuit according to claim 1 by running a plurality of testing devices in parallel, transferring a plurality of current values or voltage values obtained by the respective testing devices from the plurality of testing devices to a host computer via communication channels, the host computer determining the second test pass range based on the plurality of current values or voltage values obtained by the plurality of testing devices and transmitting the second test pass range to the plurality of testing devices via communication channels.

An information recording medium according to claim 7 of the present invention comprises a program recorded therein, the program being necessary for a computer processing unit to execute the testing method of semiconductor integrated circuit according to any of claims 1 to 6.

An information recording medium according to claim 8 of the present invention comprises a communication program recorded therein, the communication program accessing a host computer or a server having a program necessary for a computer processing unit to execute the testing method of semiconductor integrated circuit according to any of claims 1 to 6 and downloading the program to the computer processing unit.

A testing method of semiconductor integrated circuit according the present invention can prevent chips with poor diffusion quality from flowing, without conducting a high-temperature burn-in test. Also, a test can be conducted on a wafer, thus preventing the yield from being lowered.

BEST MODE FOR CARRYING OUT THE INVENTION

Hereinafter, embodiments of the present invention will be described with reference to FIGS. 1 to 6.

First Embodiment

Figure 1:
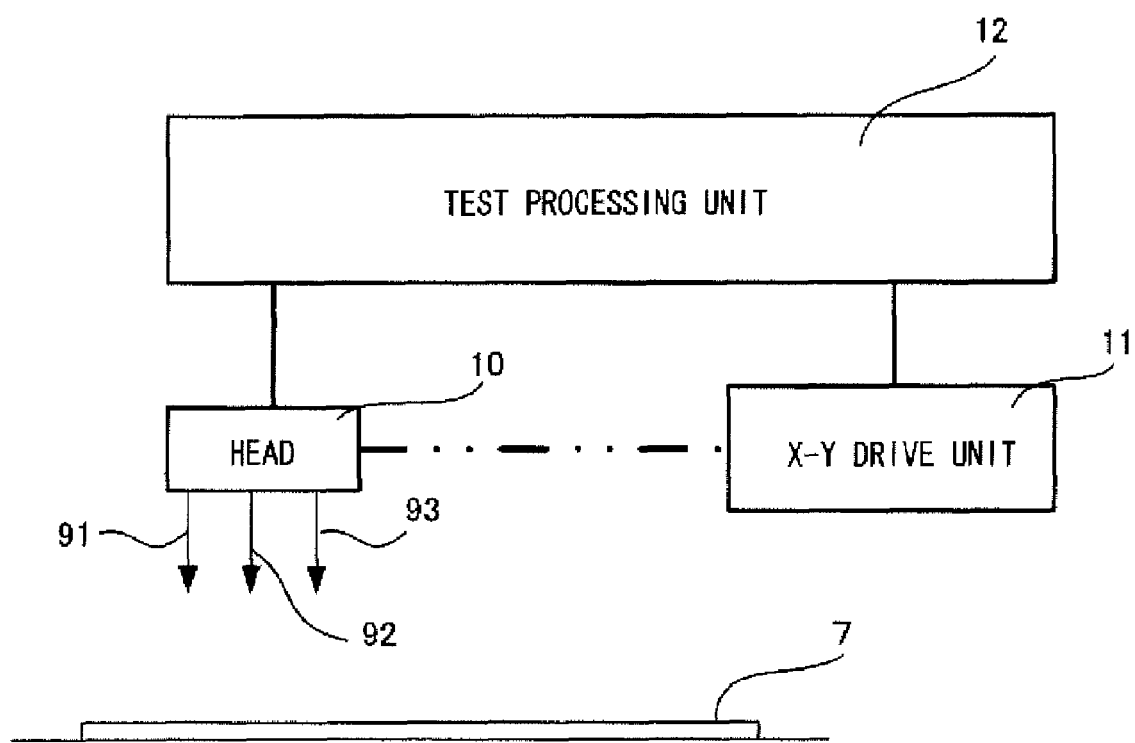
FIG. 1 is a configuration diagram of a testing device used for executing a testing method according to a first embodiment of the present invention.

FIG. 1 shows a testing device used for executing the present testing method.

Figure 2:
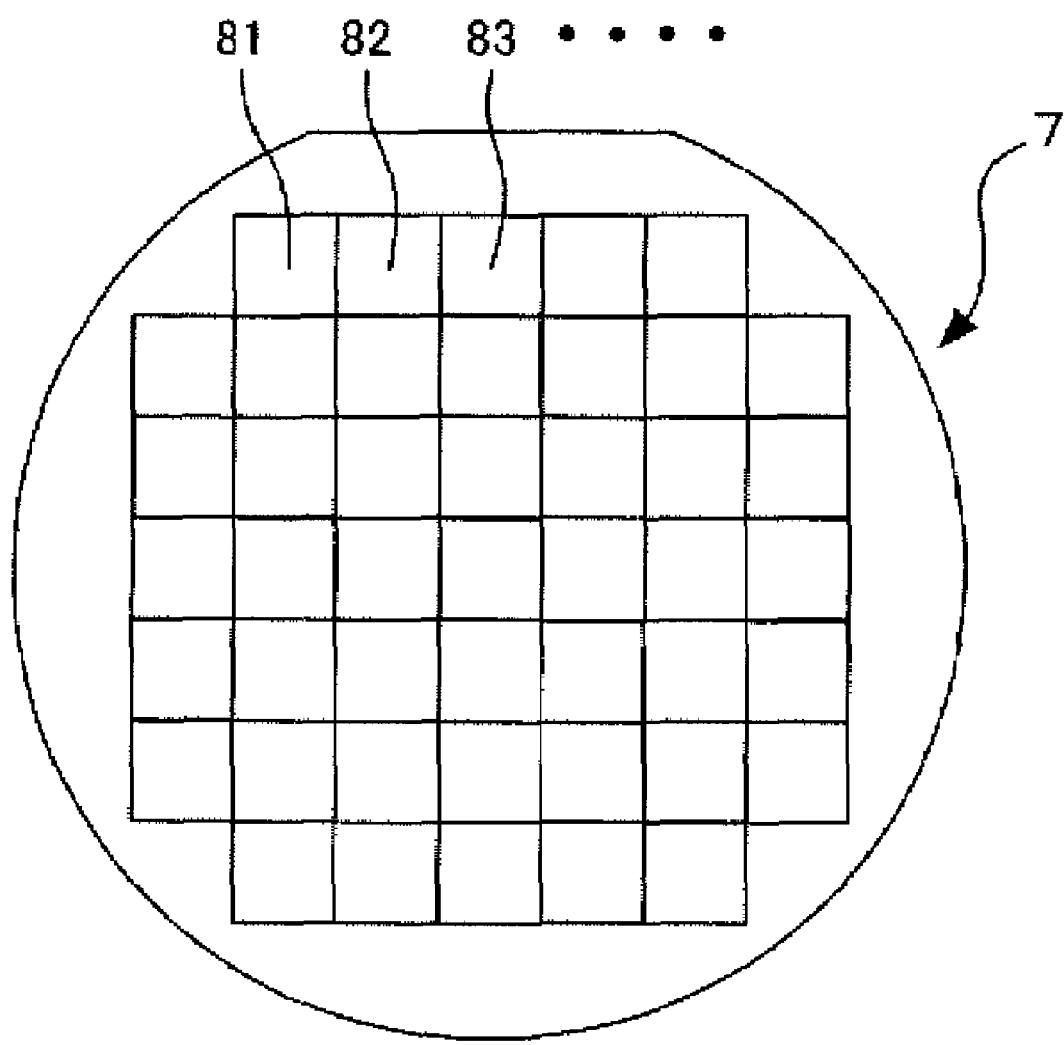
FIG. 2 is a plain view of a semiconductor wafer, which is a test target semiconductor integrated circuit.

On a wafer 7, which is a test target, a plurality of circuit areas 81, 82, 83, ... of semiconductor integrated circuits each consisting of the same circuit are formed as shown in FIG. 2. The testing device includes: a head 10 that brings test pins 91, 92 and 93 into contact with bonding pads of each circuit area 81, 82, 83, ...; an X-Y drive unit 11 that moves the head 10 to a designated address on the wafer 7; and a test processing unit 12 including a microcomputer, etc., as a main unit, the test processing unit 12 storing test data read by the head 10 and outputting the result of the judgment of whether the test data for the circuit areas 81, 82, 83, ... is acceptable or not.

Figure 3:
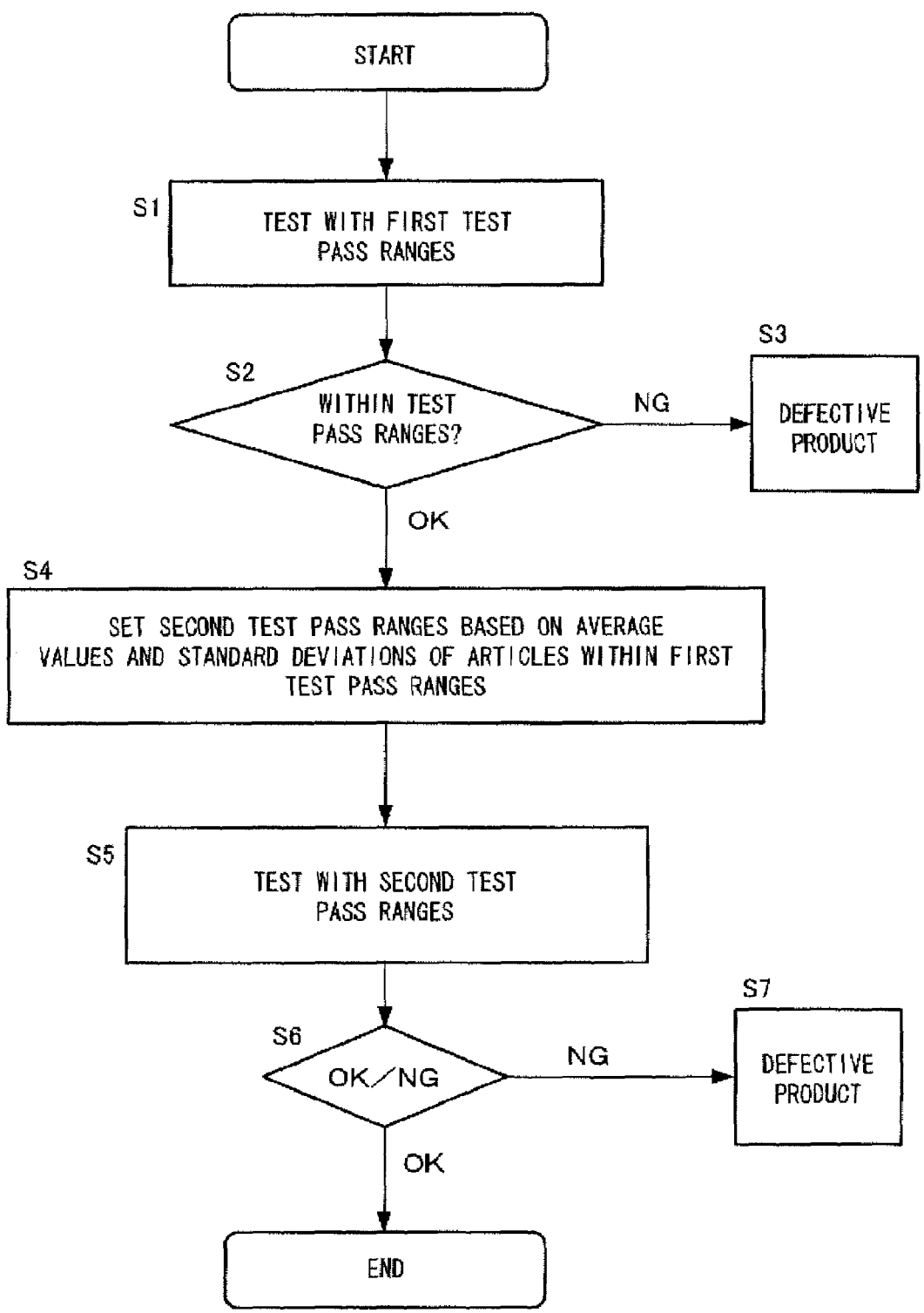
FIG. 3 is a flowchart of the first embodiment.

The test processing unit 12 has a test program written therein, the test program being necessary for executing a test flow shown in FIG. 3.

Figure 4A:
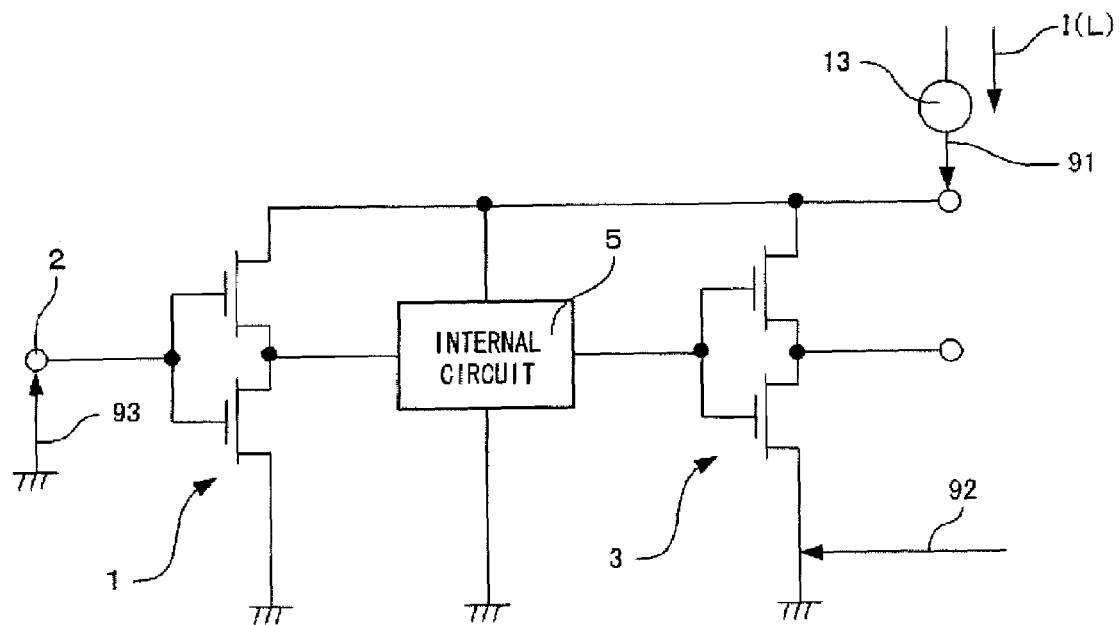
FIG. 4A is a testing circuit diagram of a test process with an input set to an "L" level in the first embodiment.
Figure 4B:
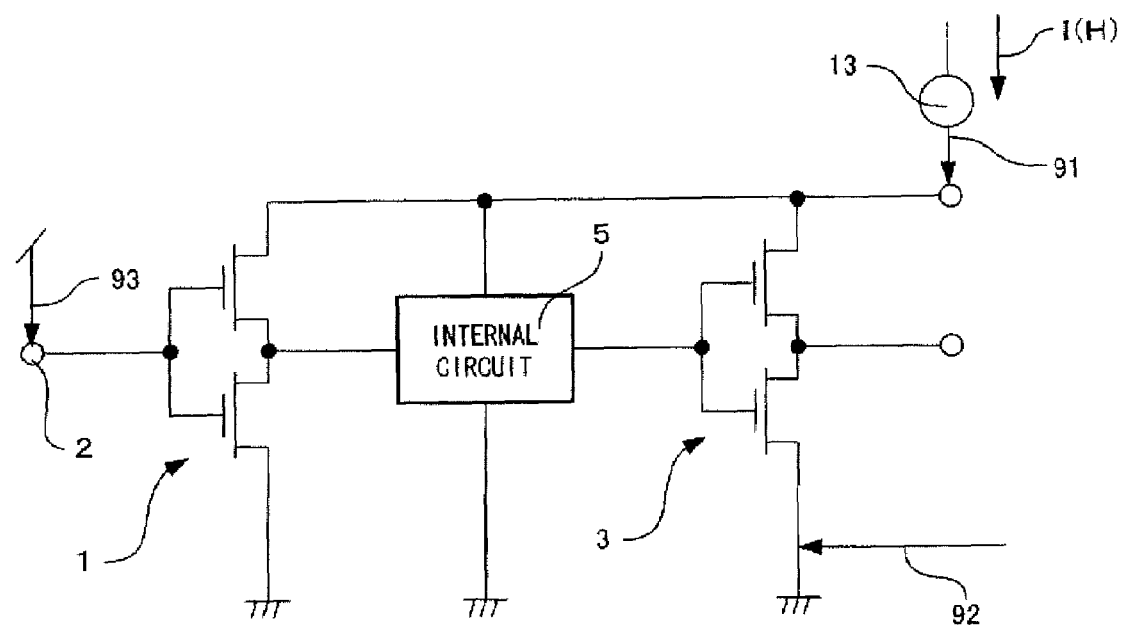
FIG. 4B is a testing circuit diagram of a test process with an input set to an "H" level in the first embodiment.

At step S1, the rest current values of power supply terminals, which are external connection terminals in the semiconductor integrated circuits formed in the circuit areas 81, 82, 83, ..., are read. More specifically, the relative positions of the wafer 7 and the head 10 are scanned by means of the X-Y drive unit 11, the head 10 is brought into contact with the circuit area 81, which is the first testing position, and as shown in FIG. 4A, a power supply voltage is applied to the semiconductor integrated circuit via the test pins 91 and 92. The test pin 93 is brought into contact with an input terminal 2, and the input is set to an "L" level. At that time, the rest current value I(L) of the rest current flowing in the power supply terminal of the semiconductor integrated circuit is read by means of an ammeter 13, and the data for the rest current value I(L) is stored in association with the address of the circuit area (X-Y coordinate). Next, as shown in FIG. 4B, the input of the input terminal 2 is switched to an "H" level, and at that time the rest current value I(H) of the rest current flowing in the power supply circuit is read by means of the ammeter 13, and stored in association with the address of the circuit area.

The rest current mentioned here means power supply current flowing in a power supply terminal of a semiconductor integrated circuit when the logic state of the semiconductor integrated circuit, which is a measured circuit, is stable. More specifically, the logic state of an internal circuit 5 can be fixed by setting the voltage applied to an external input terminal (bonding pad) of the semiconductor integrated circuit to the "H" level or the "L" level.

Here, several representative test input patterns will be described.

When the internal circuit 5 of a semiconductor integrated circuit, which is a measured circuit, is a simple logic circuit, if the external connection terminal 2 is set to the "L" level, a MOS transistor T1 is turned on and a MOS transistor T2 is turned off, and a preceding circuit 1 exhibits an "H" level output. Also, if the internal circuit 5 includes two inverters in which the internal circuits 5 are connected in series, the internal circuit 5 exhibits an "H" level output, and a succeeding circuit 3 is set so that a MOS transistor T4 is turned on and a MOS transistor T3 is turned off, and an external connection terminal 4 exhibits an "L" level output. When the power supply current of the power supply terminal, that is, the rest current is measured in this state, the total leakage current of a MOS transistor (not shown) that should be off when an "L" level is input to the external connection terminal 2, from among a plurality of MOS transistors contained in the internal circuit 5, and the MOS transistors (T2 and T3) can be measured. On the other hand, when the input of the external connection terminal 2 is set to an "H" level, the total leakage current of a MOS transistor (not shown) that should be off when an "H" level is input, from among the plurality of MOS transistors contained in the internal circuit 5, and the MOS transistors (T1, T4) can be measured.

If the internal circuit 5 is a random logic circuit that operates by means of a plurality of external input signals, the conditions for the external input signals are changed so that all the MOS transistors contained in the preceding circuit 1, the internal circuit 5 and the succeeding circuit 3 are off, and the rest current is measured every time the input condition is changed.

If the internal circuit 5 is a logic circuit containing a counter, first, a power supply voltage is applied to the power supply terminal, and then a reset signal or a set signal is input from the outside to make the counter enter an initial state. Then, the rest current of the entire circuit including the internal circuit 5 in the initial state, the preceding circuit 1 and the succeeding circuit 2 is measured. Next, the predetermined number of clock signals is input to the counter to change the output of the counter, and the rest current is measured every time the change is made.

In the aforementioned method, a MOS transistor with poor voltage withstanding or with current leakage can be found by changing the input conditions for the external input signals, and changing the operating state of each gate circuit contained in the internal circuit, setting each MOS transistor to be off and measuring the rest current that is the total leakage current of many logic circuits connected to the power supply terminal.

In the aforementioned evaluation method, individual leakage current cannot be measured specifying each MOS transistor. Thus, a power supply voltage that is greater than a rated power supply voltage, for example, 6V, which is increased by approximately 20% when the rated power supply voltage is 5V, is applied to operate the circuit to obtain a sufficient margin for normal operation at the rated power supply voltage.

Upon the completion of the measurement of the rest current values I(L) and the rest current values I(H) for the same circuit area 81 as shown in FIGS. 4A and 4B, the X-Y drive unit 11 moves the head 10 to the circuit area 82, and the measurement of the rest current values I(L) and the rest current values I(H) for the next-coming circuit area 82 are executed in a similar manner. Thereafter, the measurement of the rest current values I(L) and the rest current values I(H) for the remaining circuit areas of the wafer 7 are executed in a similar manner, by making the head 10 sequentially scan on the circuit areas.

At step S2, whether or not the respective rest current values I(L) of the circuit areas 81, 82, 83, . . . collected at step S1 fall within a predetermined first test pass range I1(L) is checked (see FIG. 5). Also, whether or not the respective rest current values I(H) of the circuit areas 81, 82, 83, . . . collected at step S1 fall within a predetermined first test pass range I1(H) is checked. In the judgment at this step S2, a circuit area passes a primary test as a non-defective product if the rest current value I(L) of the circuit area is within the first test pass range I1(L) and the rest current value I(H) of the circuit area is also within the first test pass range I1(H). Furthermore, when the yield per wafer, which is a test unit in this case, is poor and falls under a predetermined value, for example, when the yield falls below 50%, the wafer is determined to be defective and is excluded at step S3, i.e., the wafer is not sent to the next step. If the yield per wafer is equal to or exceeds the predetermined value, step S4 is executed for the circuit areas that have been judged as non-defective products at the primary test.

The criterion for determining a wafer to be defective is experimentally determined in connection with the reliability of the semiconductor integrated circuits that have been determined to be non-defective products, the production efficiency and the test costs, and the aforementioned criterion, that is, the yield of 50% may be changed.

At step S4, a second test pass range I2(L) and a second test pass range I2(H), which are criteria for judgment in a secondary test, are determined, and the secondary test is conducted using these pass ranges at step S5.

Here, the second test pass range I2(L) and the second test pass range I2(H) are not predetermined values such as the first test pass range I1(L) and the first test pass range I1(H). More specifically, an average value Ave(L) and a standard deviation value σ(L) are obtained based on the distribution of the rest current values I(L) in one wafer that has passed the primary test, and the wafer is checked at step S5 using $$\text{Ave(L)} \pm 3 \cdot \sigma(L)$$

which can be obtained from the average value Ave(L) and the standard deviation value σ(L), as the second test pass range I2(L). The second test pass range I2(H) is also determined in a similar manner: an average value Ave(H) and a standard deviation value σ(H) are obtained based on the distribution of the rest current values I(H) in one wafer that has passed the primary test, and the wafer is checked at step S5 using $$\text{Ave(H)} \pm 3 \cdot \sigma(H)$$

which can be obtained from the average value Ave(H) and the standard deviation σ(H), as the second test pass range I2(H).

The upper limit value of the second test pass range I2(L) may be set to Ave(L)±3·σ(L), and the lower limit value of the first test pass may be used for the lower limit value of the second test pass range I2(L).

Also, the lower limit value of the second test pass may be set to Ave(L)−3·σ(L) and the upper limit value of the first test pass may be used for the upper limit value of the second test pass. The second test pass range I2(H) may be set in a similar manner.

The results of step S5 are judged at step S6 to redetermine whether or not each semiconductor integrated circuit is a non-defective product or defective product, and are stored in the test processing unit 12 in association with the addresses on the wafer 7 of the respective semiconductor integrated circuits. The defective products are excluded at step S7, and only the non-defective products are extracted and sent out to the succeeding production line.

Figure 5A:
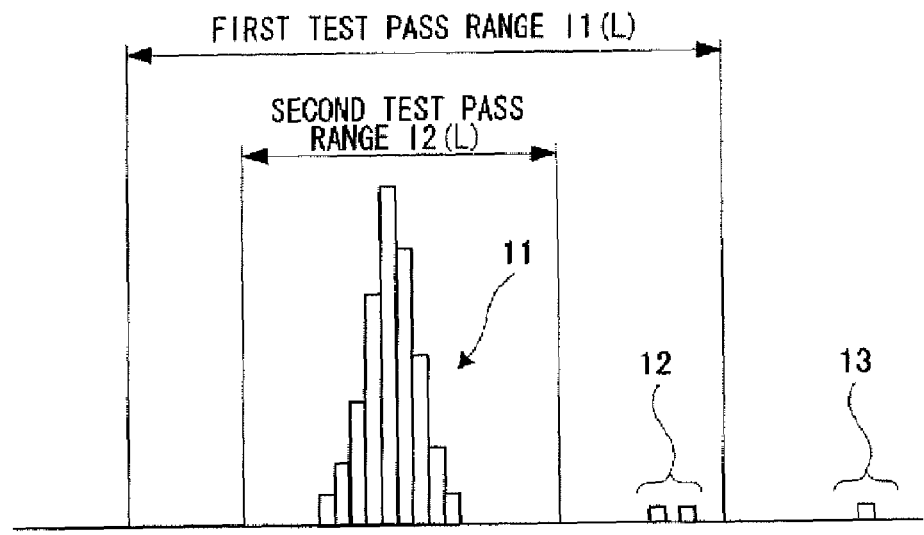
FIG. 5A is an explanatory diagram of a first test pass range according to the first embodiment.
Figure 5B:
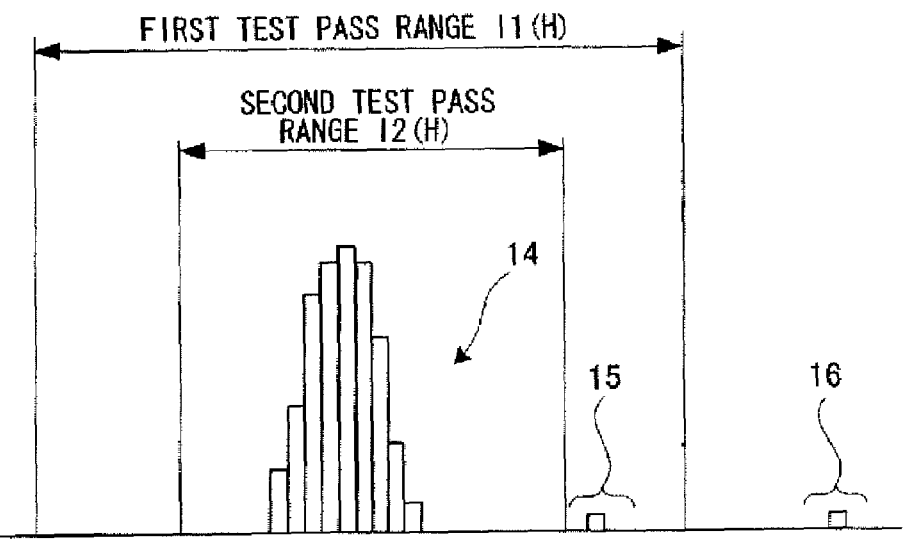
FIG. 5B is an explanatory diagram of a second test pass range according to the first embodiment.

FIGS. 5A and 5B show the relationship between the first test pass ranges and the second test pass ranges at steps S1 and S5. The rest current value I(L) of each semiconductor integrated circuit that has been determined to be within the test pass ranges at the primary test are checked to determine whether the rest current value I(L) is within the second test pass range I2(L) which is within the first test pass range I1(L), and if the rest current value I(L) is within the second test pass range I2(L), the relevant semiconductor integrated circuit is determined to be a non-defective product 11 for that test item. Reference numeral 12 denotes an article outside the second test pass, and reference numeral 13 denotes an article outside the first test pass.

The same judgment is made for I(H). A semiconductor integrated circuit that has been determined to be a non-defective product with regard to both I(L) and I(H) is extracted as a final non-defective product 14. Reference numeral 15 denotes an article outside the second test pass, and reference numeral 16 denotes an article outside the first test pass.

Since the target for this test is the wafer 7, the semiconductor integrated circuits are cut out from the wafer 7 in the form of chips, and then chip selection is conducted based on the addresses of the chips on the wafer 7 and the test results at step S6.

Since in the semiconductor integrated circuits subjected to the same diffusion processing at the time of manufacturing, the respective circuit areas have almost equal rest current values, so the center value varies by diffusion processing unit (wafer or production lot), but the distribution will be a regular distribution. It is highly likely that the chips with their rest current values deviated from the regular distribution have device defects, cracks or oxide film abnormalities.

Accordingly, as a result of conducting a retest with the second test pass ranges, chips with poor quality that have been determined to be non-defective products for the first test pass ranges, but have been deviated from the regular distribution are determined to be articles outside the second test pass ranges, that is, defective products, and thus, do not proceed to the next step.

The exclusion of defective chips at step S7 is conducted by performing chip selection based on the addresses on the wafer 7 and the test results at step S6 after dividing and cutting the chips from the wafer. However, the chip selection can be performed based on whether each semiconductor integrated circuit has a marking before dividing and cutting the chips from the wafer, by a marking unit (not shown), which is controlled by the test processing unit 12, performing marking on the semiconductor integrated circuits identified as defective products based on the judgment results at step S6 before dividing and cutting the semiconductor integrated circuits from the wafer as chips.

Some of the semiconductor integrated circuits may have a plurality of power supply terminals, or a plurality of input terminals, and also, there may be a plurality of test pass ranges I1(L), I1(H), I2(L) and/or I2(H).

Also, the test flow may include a test item for which the judgment is made only with regard to whether or not each semiconductor integrated circuit is within the first test pass range, other than the aforementioned steps.

Second Embodiment

Figure 6:
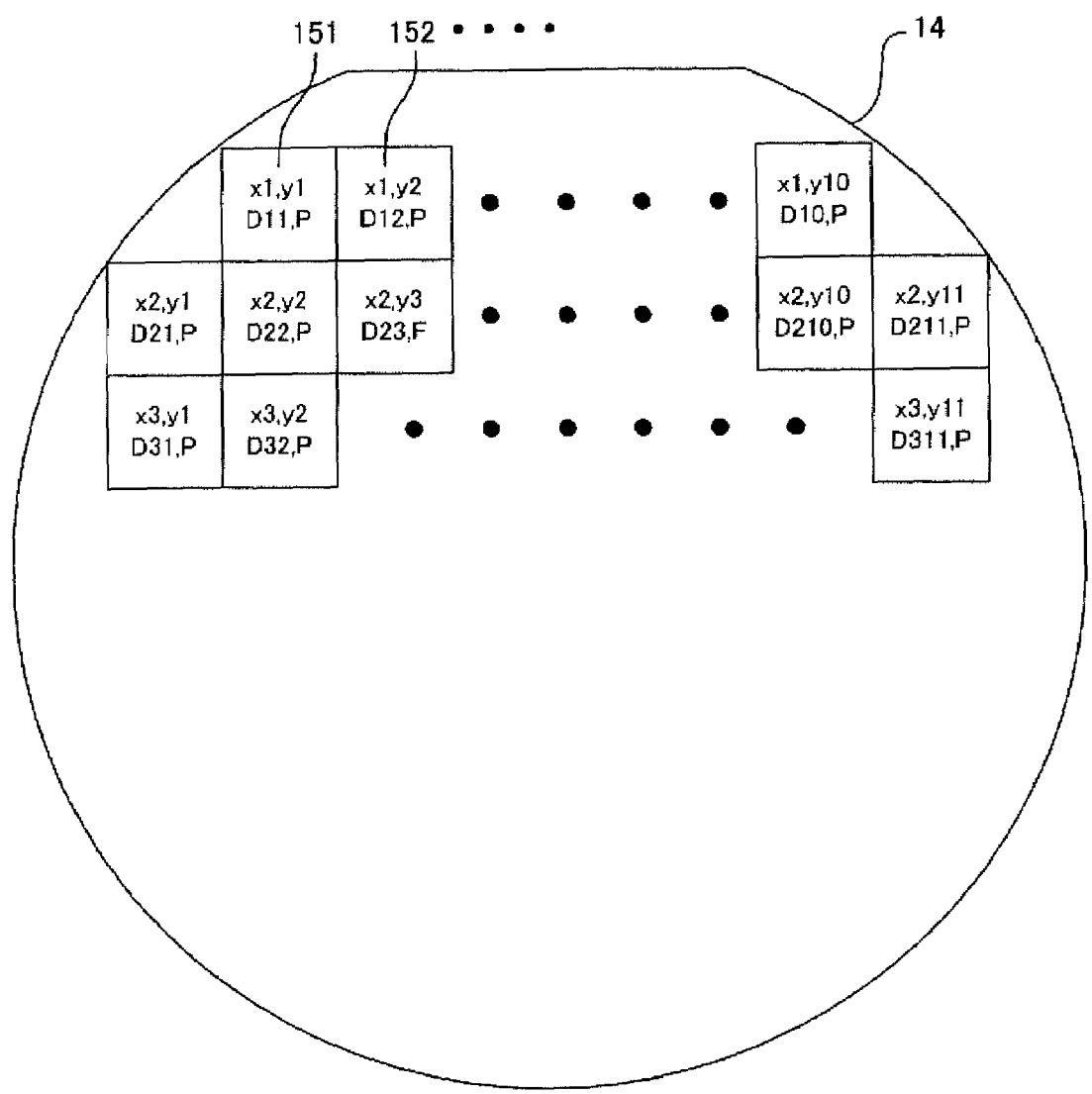
FIG. 6 is a wafer map diagram describing a second embodiment of the present invention.
Figure 7:
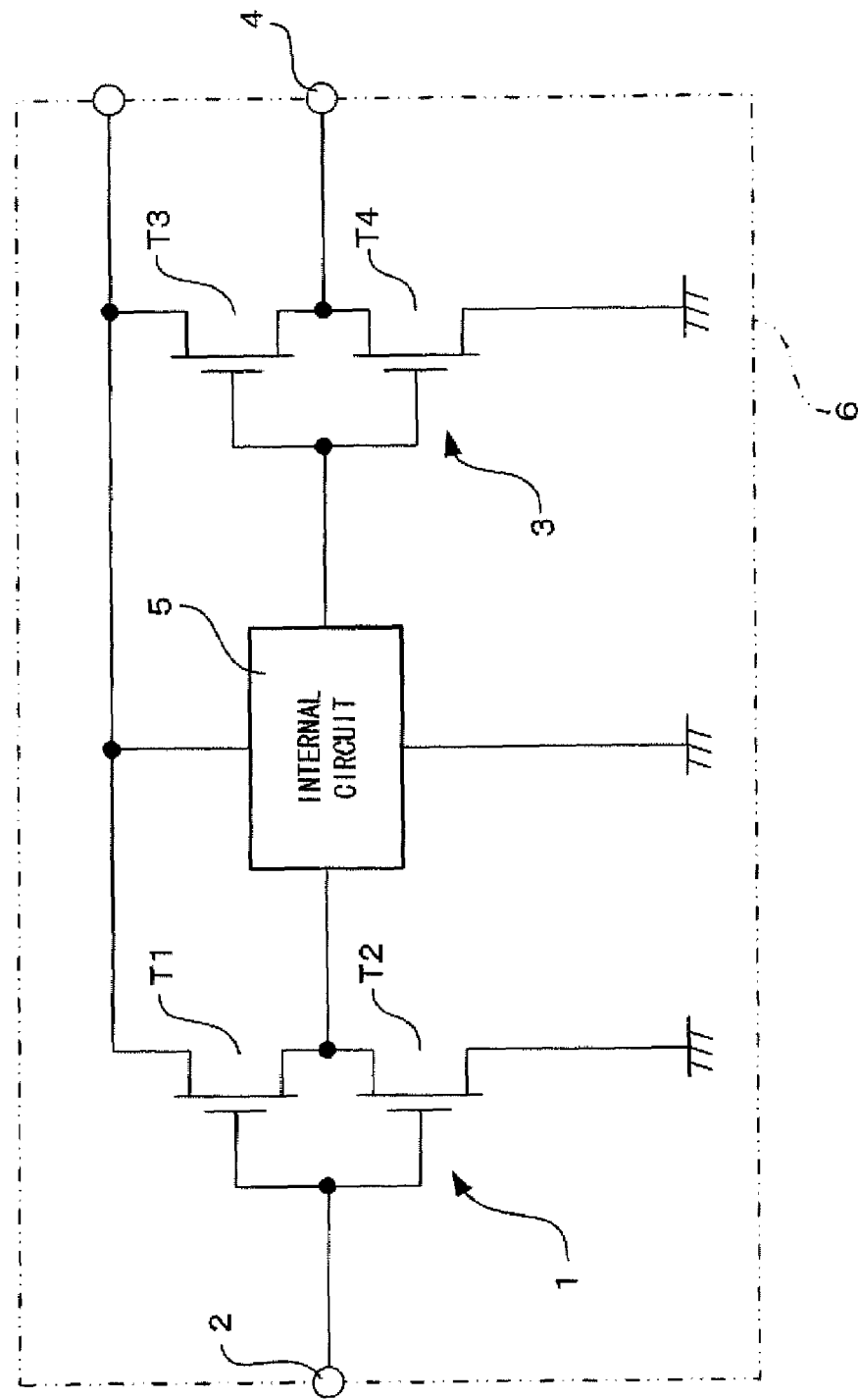
FIG. 7 is a general configuration diagram of a semiconductor integrated circuit.

FIG. 6 shows a second embodiment of the present invention.

In the first embodiment, the results of the primary test and the secondary test are stored in association with the addresses on the wafer 7 of the semiconductor integrated circuits. FIG. 6 shows a specific example of that arrangement, in which the test results stored in association with the addresses on a wafer 7 of semiconductor integrated circuits are output as wafer map data, thereby achieving better handling of the test results. More specifically, the upper tier of two tiers indicated in areas 151, 152, 153, . . . of circuit areas 81, 82, 83, . . . inside an outline 14 of the wafer 7 denotes the address on the wafer 7 of the relevant circuit area. The first items D11, D12, D13, . . . in the lower tiers denote data on the rest current values I(L) and the rest current values I(H), and the second items following the first items, which is divided from the first items by commas denote the results of judgment of whether the respective semiconductor integrated circuits are non-defective or defective, and here, "P" is indicated for non-defective products and "F" is indicated for defective products.

In the aforementioned embodiments, the test unit is set to be a wafer, and for determining the second test pass ranges I2(L) and I2(H), the measurement data of the rest current values of all the semiconductor integrated circuits formed on one wafer under test, or the measurement data of the rest current values of a certain number of semiconductor integrated circuits from among all the semiconductor integrated circuits formed on one wafer under test is used. However, it is also possible that the test unit is set to be a plurality of wafers; that the second test pass ranges I2(L) and I2(H) are determined based on the measurement data of the rest current values of all the semiconductor integrated circuits formed on the plurality of wafers; and that these second test pass ranges I2(L) and I2(H) and the measurement data of the rest current values of the semiconductor integrated circuits on a wafer under test are compared to perform a retest of whether the respective semiconductor integrated circuits are non-defective or defective products, thereby extracting non-defective semiconductor integrated circuits.

It is also possible that the test unit is set to be a plurality of wafers; that the second test pass ranges I2(L) and I2(H) are determined based on the measurement data of the rest current values of all or a certain number of semiconductor integrated circuits formed on a certain number of wafers that have been tested immediately before, the certain number being equal to or smaller than the number of all the semiconductor integrated circuits; and that these second test pass ranges I2(L) and I2(H) and the measurement data of semiconductor integrated circuits formed on a wafer under test are compared to perform a retest of whether the respective semiconductor integrated circuits are non-defective or defective products, thereby extracting non-defective semiconductor integrated circuits.

Also, in the aforementioned embodiments, a second test pass range is set to be three times a standard deviation value $\sigma$, putting an average value Ave as the center. However, both ensuring of reliability and test time reduction can be achieved by changing the three-time value according to a required reliability standard, or modifying the three-time value by feeding back the product-stage test results of semiconductor integrated circuit elements manufactured using the final non-defective products selected by executing the test method according to any of the aforementioned embodiments to the wafer test stage.

In the aforementioned embodiments, the case where one testing device is used is described as an example. However, when wafers having the same configuration are tested by running a plurality of testing devices in parallel, more proper test results can be expected by determining a second test pass range based on a plurality of rest current values obtained by the plurality of testing devices. Examples of a specific communication system between the parallel-running testing devices in those cases may include an arrangement in which a plurality of rest current values obtained by the respective testing devices are transferred from the plurality of testing devices to a host computer via communication channels, and the host computer determines a second test pass range based on the plurality of rest current values obtained by the plurality of testing devices, and transmits the second test pass range to the plurality of testing devices via various types of communication channels.

A program necessary for a test processing unit to execute the test method according to any of the aforementioned embodiments can be distributed in the form of various types of portable information recording media, such as a magnetic tape, a magnetic disk, an optical disk, memory such as ROM or RAM, or a USB memory unit containing memory. Instead of various types of portable information recording media, the program can also be downloaded to a host computer or a server apparatus, etc., installed at a place remote from the place where the testing device is installed, via an Internet system using an optical cable, a telephone line, or radio waves. In those cases, a communication channel interposed between the host computer or server apparatus and the testing device can also be considered as an information recording medium.

Furthermore, when the aforementioned communication channel is considered as an information recording medium, media recording a communication program for downloading a program necessary for a testing device to execute the test method by accessing a host computer or server having the program can also be considered as the information recording medium.

In the aforementioned embodiments, the case where rest current is used as a test item, that is, where the current value of a power supply terminal obtained for each semiconductor integrated circuit is compared with test pass ranges to extract semiconductor integrated circuits within the test pass is described as an example. However, the preset invention is not limited to the case, and the voltage withstanding measurements of semiconductor integrated circuits can also be employed. In those cases, the voltage value of a power supply terminal obtained for each semiconductor integrated circuit is compared with test pass ranges to extract semiconductor integrated circuits within the test pass.

In the aforementioned embodiments, the measurement values of power supply terminals as external connection terminals of the semiconductor integrated circuits are compared with test pass ranges to extract articles within the pass. However, the measured terminals are not limited to the power supply terminals, and the articles within the test pass can be extracted based on the measurement values of other external connection terminals of the semiconductor integrated circuits.

INDUSTRIAL APPLICABILITY

The present invention is useful for a test method for guaranteeing the quality of a semiconductor integrated circuit.

The invention claimed is:

1. A method of testing on a test unit basis, a plurality of semiconductor integrated circuits each containing a same circuit, the method comprising:
setting input data for operating an internal circuit of a semiconductor integrated circuit to be tested, inputting the input data through an external connection terminal of a semiconductor integrated circuit being tested, and comparing a current value or a voltage value obtained at the external connection terminal of each of a plurality of semiconductor integrated circuits with a first test pass range to identify semiconductor integrated circuits within the first test pass from the plurality of semiconductor integrated circuits; and
comparing a second test pass range determined based on the current values or the voltage values of the semiconductor integrated circuits extracted as being within the first test pass, the second test pass range being narrower than the first test pass range, and the current values or the voltage values of the plurality of semiconductor integrated circuits, thereby identifying semiconductor integrated circuits within the second test pass.

2. A testing method of semiconductor integrated circuit comprising: executing the testing method of semiconductor integrated circuit according to claim 1 by running a plurality of testing devices in parallel; and determining the second test pass range based on a plurality of current values or voltage values obtained by the plurality of testing devices.

3. An information recording medium comprising a program recorded therein, the program being necessary for a computer processing unit to execute the testing method of semiconductor integrated circuit according to claim 2.

4. An information recording medium comprising a communication program recorded therein, the communication program accessing a host computer or a server having a program necessary for a computer processing unit to execute the testing method of semiconductor integrated circuit according to claim 2 and downloading the program to the computer processing unit.

5. A testing method of semiconductor integrated circuit comprising: executing the testing method of semiconductor integrated circuit according to claim 1 by running a plurality of testing devices in parallel; transferring a plurality of current values or voltage values obtained by the respective testing devices from the plurality of testing devices to a host computer via communication channels, the host computer determining the second test pass range based on the plurality of current values or voltage values obtained by the plurality of testing devices; and transmitting the second test pass range to the plurality of testing devices via communication channels.

6. An information recording medium comprising a program recorded therein, the program being necessary for a computer processing unit to execute the testing method of semiconductor integrated circuit according to claim 5.

7. An information recording medium comprising a communication program recorded therein, the communication program accessing a host computer or a server having a program necessary for a computer processing unit to execute the testing method of semiconductor integrated circuit according to claim 5 and downloading the program to the computer processing unit.

8. An information recording medium comprising a program recorded therein, the program being necessary for a computer processing unit to execute the testing method of semiconductor integrated circuit according to claim 1.

9. An information recording medium comprising a communication program recorded therein, the communication program accessing a host computer or a server having a program necessary for a computer processing unit to execute the testing method of semiconductor integrated circuit according to claim 1 and downloading the program to the computer processing unit.

10. A method of testing, while part of a wafer, a plurality of semiconductor integrated circuits each containing a same circuit, the method comprising:
setting input data for operating an internal circuit of a semiconductor integrated circuit to be tested, inputting the input data through an external connection terminal of a semiconductor integrated circuit being tested, and comparing a current value or a voltage value obtained at the external connection terminal of each of a plurality of semiconductor integrated circuits with a first test pass range to identify semiconductor integrated circuits within the first test pass from the plurality of semiconductor integrated circuits; and comparing a second test pass range determined based on the current values or the voltage values of the semiconductor integrated circuits extracted as being within the first test pass, the second test pass range being narrower than the first test pass range, and the current values or the voltage values of the plurality of semiconductor integrated circuits, thereby identifying semiconductor integrated circuits within the second test pass.

11. The testing method of semiconductor integrated circuit according to claim 10, wherein the second test pass range is set based on an average value and a standard deviation value of the current values or the voltage values of the plurality of semiconductor integrated circuits.

12. An information recording medium comprising a program recorded therein, the program being necessary for a computer processing unit to execute the testing method of semiconductor integrated circuit according to claim 10.

13. An information recording medium comprising a communication program recorded therein, the communication program accessing a host computer or a server having a program necessary for a computer processing unit to execute the testing method of semiconductor integrated circuit according to claim 10 and downloading the program to the computer processing unit.

14. A method of testing, while part of a wafer, a plurality of semiconductor integrated circuits each containing a same circuit, the method comprising:

setting input data for operating an internal circuit of a semiconductor integrated circuit to be tested, inputting the input data through an external connection terminal of a semiconductor integrated circuit being tested, and comparing a current value or a voltage value obtained at the external connection terminal of each of a plurality of circuit areas with a first test pass range to identify semiconductor integrated circuits within the first test pass from the plurality of semiconductor integrated circuits; and comparing a second test pass range determined based on the current values or the voltage values of the semiconductor integrated circuits extracted as being within the first test pass, the second test pass range being narrower than the first test pass range, and the current values or the voltage values of the plurality of semiconductor integrated circuits, thereby identifying semiconductor integrated circuits within the second test pass, and storing the test results in association with addresses on the wafer of the tested semiconductor integrated circuit.

15. The testing method of semiconductor integrated circuit according to claim 14, wherein the second test pass range is set based on an average value and a standard deviation value of the current values or the voltage values of the plurality of semiconductor integrated circuits.

16. An information recording medium comprising a program recorded therein, the program being necessary for a computer processing unit to execute the testing method of semiconductor integrated circuit according to claim 14.

17. An information recording medium comprising a communication program recorded therein, the communication program accessing a host computer or a server having a program necessary for a computer processing unit to execute the testing method of semiconductor integrated circuit according to claim 14 and downloading the program to the computer processing unit.

* * * * *